US009735793B2

(12) United States Patent
Cheng Chang et al.

(10) Patent No.: US 9,735,793 B2
(45) Date of Patent: Aug. 15, 2017

(54) LOW-POWER CLOCK REPEATERS AND INJECTION LOCKING PROTECTION FOR HIGH-FREQUENCY CLOCK DISTRIBUTIONS

(71) Applicant: Freescale Semiconductor, Inc., Austin, TX (US)

(72) Inventors: Kevin Yi Cheng Chang, Tempe, AZ (US); Muhammad Z. Islam, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/962,696

(22) Filed: Dec. 8, 2015

(65) Prior Publication Data

US 2017/0163274 A1 Jun. 8, 2017

(51) Int. Cl.
*H03L 7/06* (2006.01)
*H03L 7/24* (2006.01)
*H03K 5/15* (2006.01)

(52) U.S. Cl.
CPC .......... *H03L 7/24* (2013.01); *H03K 5/15013* (2013.01)

(58) Field of Classification Search
CPC .............................. H03K 5/15013; H03L 7/06
USPC .......................................................... 327/147
See application file for complete search history.

(56) References Cited

U.S. PATENT DOCUMENTS 8,102,452 B1 1/2012 Wyatt
8,291,257 B2 10/2012 Stephens et al.
8,400,192 B2 3/2013 Papaefthymiou et al.
8,791,742 B2 7/2014 Garg et al.
2005/0114820 A1 5/2005 Restle
2011/0234277 A1 9/2011 Stephens et al.
2014/0035649 A1 2/2014 Nedovic
2014/0055180 A1 2/2014 Garg et al.

*Primary Examiner* — Ryan Jager

(57) ABSTRACT

A low power clock distribution circuit system (200) includes a clock generator (201) for generating a high frequency clock signal that is supplied to a clock interconnect running to multiple lanes of an integrated circuit, each lane including a passive clock repeater circuit (e.g., 203) having a differential-mode RLC network (e.g., 301) that is shielded by an active guard ring structure (e.g., 511) and that is coupled to receive first and second input clock signals (Vip, Vin) to provide clock signal gain boosting at a predetermined frequency range and clock signal attenuation out of the operating frequency range, thereby generating the first and second output clock signals (Vop, Von) that are provided to a clocked circuit (e.g., 211).

13 Claims, 5 Drawing Sheets

LOW-POWER CLOCK REPEATERS AND INJECTION LOCKING PROTECTION FOR HIGH-FREQUENCY CLOCK DISTRIBUTIONS

BACKGROUND OF THE INVENTION

Field of the Invention

The present invention is directed in general to data processing systems. In one aspect, the present invention relates to clock distribution to multiple lanes on an integrated circuit chip.

Description of the Related Art

A data processing system may require multiple clock signals for certain applications. Typically, a plurality of clock drivers are distributed along a clocking path to drive all the clock signal loads along the clocking path, especially in high clock frequency applications such as serializer/deserializer (SerDes) clocking scheme. Such clock drivers may employ phase-locked loops (PLLs) to generate the clock signals in phase with the phase of a master or reference clock signal, but when inductive clock drivers are operating at the same frequency or harmonically related frequencies, there is a significant risk of injection locking problems arising due to electric and magnetic couplings between inductive components causing serious interference between clock nets. Injection locking may pull the PLL output clock signals out of phase with their respective reference clock signals and/or result in duty cycle distortions on the local clock signal. This conflict between the inherent operation of the PLLs and injection locking can result in the PLLs generating clock signals with an unacceptable level of jitter. Existing solutions for controlling injection locking effects employ dedicated circuitry for detecting and correcting operations at the cost of higher circuit complexity and power consumptions. Other solutions attempt to isolate the PLLs to reduce the coupling between the PLLs to an insignificant level, but such PLL isolation techniques have limited effectiveness as PLLs increasingly operate at high frequencies (resulting in higher sensitivity to jitter) and/or as device dimensions shrink (resulting in reduced isolation effectiveness as the distance between PLLs is reduced). As a result, the existing solutions for protecting against injection locking are extremely difficult at a practical level.

BRIEF DESCRIPTION OF THE DRAWINGS

The present invention may be understood, and its numerous objects, features and advantages obtained, when the following detailed description is considered in conjunction with the following drawings.

DETAILED DESCRIPTION

A clock distribution circuit, system, and methodology are described for using low power, actively shielded passive clock repeaters along a clock path to provide a substantial voltage gain at each repeater stage within a specified frequency range while consuming little or no power and protecting against injection locking effects. In selected embodiments, each passive clock repeater is a resonant clock repeater circuit which employs a differential-mode RLC network which uses one series inductor L, one series capacitor C, and a resistive voltage-divider at each half circuit to provide gain-boosting at the desired frequency range with attenuated signal gain out of the operating frequency range. Each resonant clock repeater circuit may also include tunable shunt capacitor Csh between the differential lines that may be tuned for the desired operation frequency of the resonant clock repeater circuit. By employing the passive resonant clock repeater circuits at each Transmitter/Receiver (TX/RX) lane along the clock path, sufficient voltage-swing of the clock signal can be sustained along the clock path so that the clock driver at the input-side of the clock path can be run with much smaller power consumption. Since each transmission line load at the output port of the clock repeater transforms the load impedance ($Z_{Load}$) to $Z_T$ as the actual load of the clock repeater, the resistive voltage-divider circuits may be used to provide an easy duty-cycle correction when connected to separate control voltage signals and/or to establish the DC level of the output common-mode when connected to a common reference voltage Vref that can be set as a higher voltage than the input common-mode. In addition or in the alternative, each passive clock repeater may include an active guard-ring which is positioned around the clock repeater to avoid the injection-locking (ILO) effects by incorporating a passive mixer and a low-frequency clock source (e.g., the divided PLL reference frequency source) to generate a programmable offset frequency, $f_{os}$, which sets the protecting frequency-range by combining the offset frequency $f_{os}$ with the clock repeater output frequency $f_o$ at the mixer to generate an output frequency, $f_o \pm f_{os}$, that is applied to the active guard ring to deviate or shift the undesired injecting source frequency $f_X$ out of the locking range. When embodied in a high frequency SerDes clock path or the other applications where high power consumption is a concern, each lane may include a resonant clock repeater embodied as a passive LCC circuit including a series-LC and shunt-C network to overcome the loss of the signal strength along the clocking path, and may also include an active guard-ring to prevent the injection-locking interference from coupled injection sources.

Figure 1:
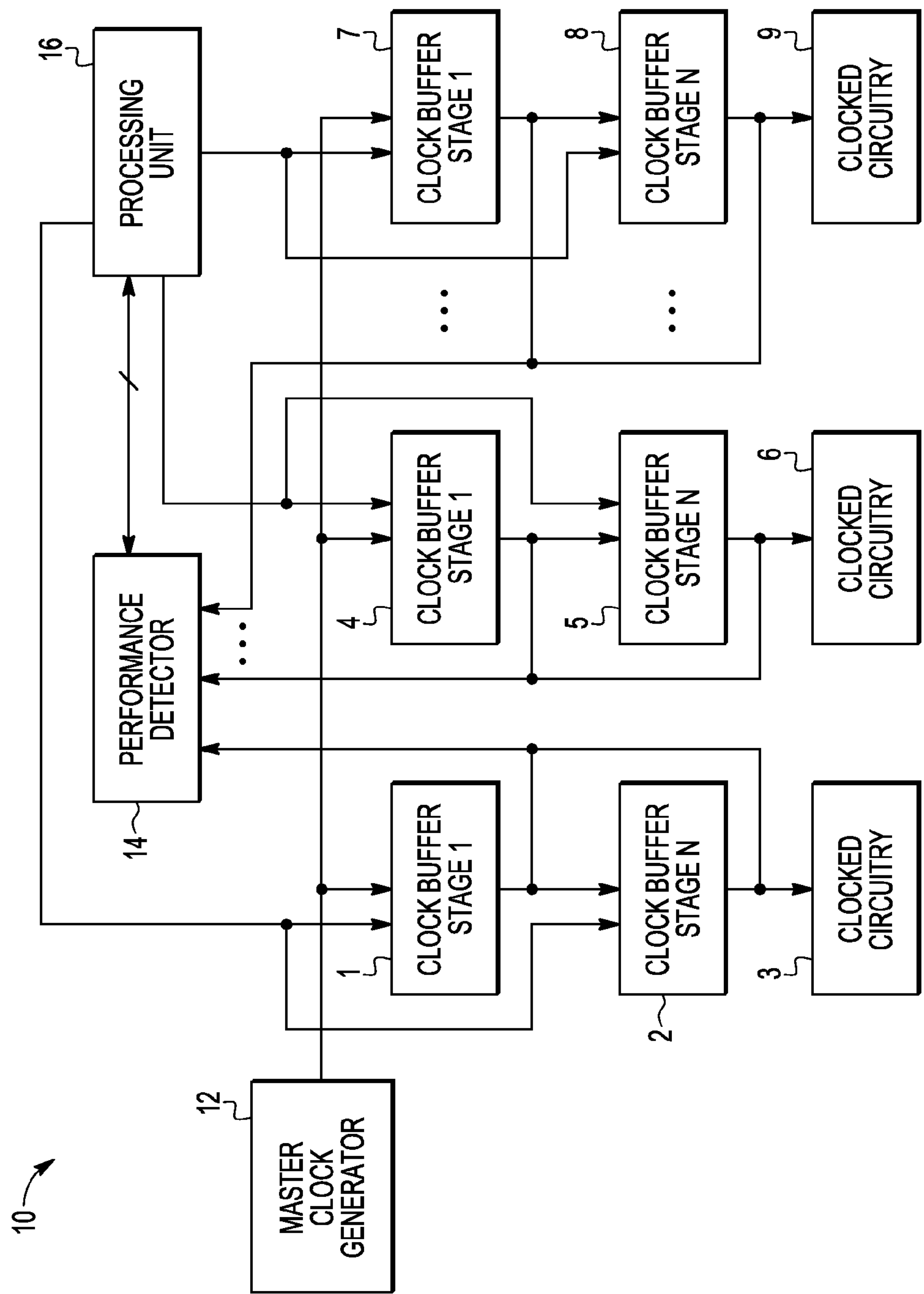
FIG. 1 illustrates a simplified block diagram of a data processing system having clock distribution paths with multiple clock drivers along each path.

Turning now to FIG. 1, there is shown a simplified schematic block diagram of a data processing system 10 having clock distribution paths with multiple clock drivers along each path. As depicted, the data processing system 10 includes a master clock generator 12 which supplies a master clock signal to a first plurality of clock buffer circuits 1, 2 along a first clock path to a first clocked circuit 3. In addition, the master clock generator 12 supplies the master clock signal to a second plurality of clock buffer circuits 4, 5 along a second clock path to a second clocked circuit 6, and also supplies the master clock signal to a third plurality of clock buffer circuits 7, 8 along a third clock path to a third clocked circuit 9. The depicted data processing system 10 also includes a performance detector 14 and processing unit 16 to monitor and control the clock buffer circuits 1-2, 4-5, 7-8 as shown. With high clock frequency applications, such as SerDes clocking schemes, the master clock generator 12 may be a high power oscillator clock driver when generating a clock signal for use with the various inductive clock buffers along the clocking paths, but such high power clock driver buffers have a high risk of injection locking problems through magnetic coupling, which have conventionally been addressed using extra circuitry (e.g., performance detector 14 and processing unit 16) to perform detection and correction operations at the cost of higher circuit complexity and power consumptions.

Figure 2A:
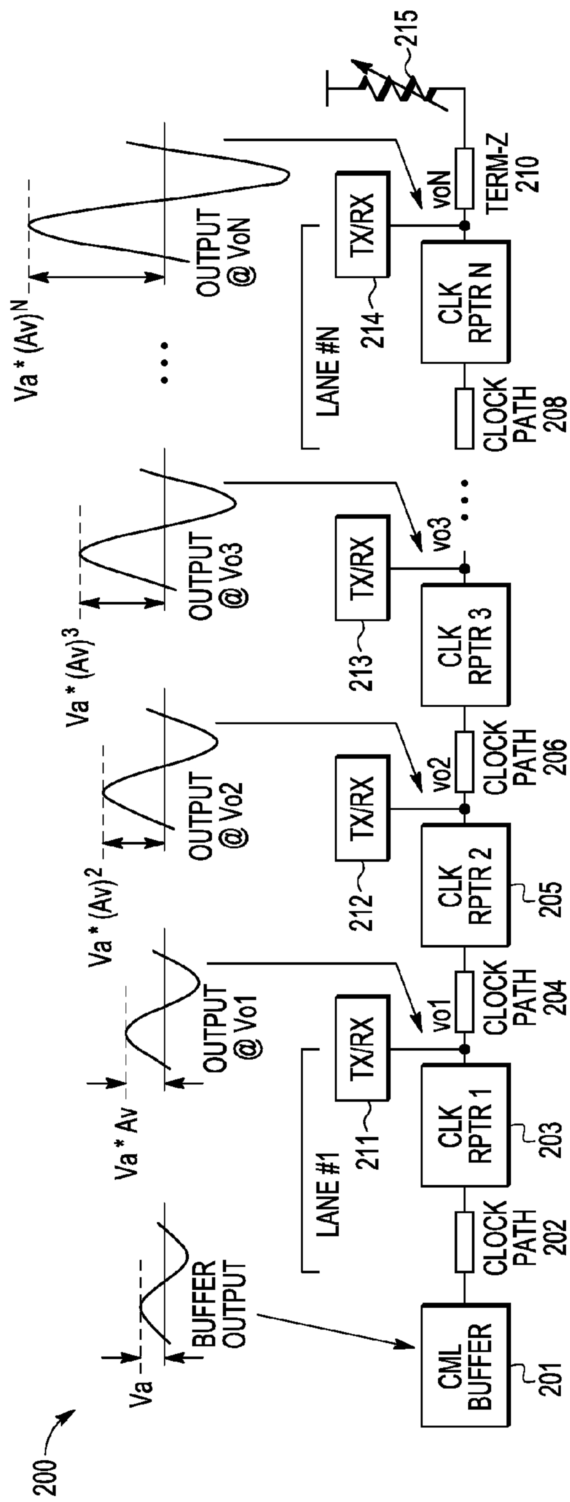
FIG. 2A illustrates a simplified block diagram of a high-frequency serializer/deserializer clock distribution path which includes passive clock repeater circuits in accordance with selected embodiments of the present disclosure.

Referring now to FIG. 2A, there is shown a simplified block diagram 200 of a high-frequency serializer/deserializer clock distribution path which includes passive clock repeater circuits in accordance with selected embodiments of the present disclosure. The depicted clock distribution path 201-210 includes a current-mode logic (CML) clock driver buffer 201 which is connected over a plurality of transmit/receive (TX/RX) lanes 1-N, each of which includes a clock path (i.e., 202, 204, 206, 208), associated clock repeater circuit 203, 205, 207, 209, and clocked transmit/receive circuit 211-214. Though not shown, it will be appreciated that the CML clock driver buffer 201 may be connected to receive a clock signal from a phase-locked loop (PLL) circuit or integrated therewith to form a clock generator. At the end of the clock distribution path 201-210, there is connected an adjustable load impedance 215 for impedance matching purposes. As will also be appreciated, the circuits in the clock distribution path 201-210 may be connected in a differential mode configuration wherein positive clock signal lines and negative clock signal lines are connected to drive receiving (RX) lanes and transmission (TX) lanes. In the example clock distribution path 201-210 shown in FIG. 2A, there may be a distance of over 2000 um between the first and Nth lanes, though there may be other distances the lanes.

Figure 2B:
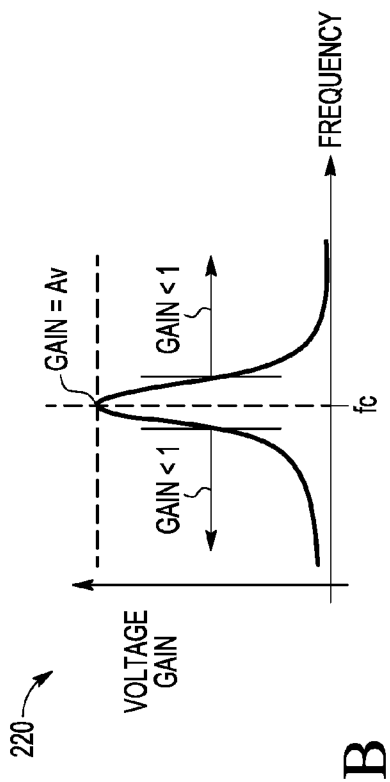
FIG. 2B illustrates an example AC gain versus frequency plot for the passive clock repeater circuits shown in FIG. 2A in accordance with selected embodiments of the present disclosure.

As the length of the depicted clock distribution path 201-210 increases, the power required by the CML buffer 201 to sustain the clock signal to each clocked TX/RX circuit 211-214 is reduced by including passive clock repeater circuits 203, 205, 207, 209 at each TX/RX lane to sustain the sufficient voltage-swing of the clock signal. In selected embodiments, each of the passive clock repeater circuits uses a differential-mode RLC network to provide gain-boosting for the received clock signal at a desired frequency range and to attenuate the clock signal gain outside of the target operating frequency range for the clock signal. Ideally, each passive clock repeater circuit (e.g., 203) consumes no power but provides a voltage-gain greater than one in a resonant frequency range of interest, in contrast to conventional passive networks which generate a gain of no more than one or otherwise require high power consuming amplifiers to increase the gain. To achieve the desired gain result, each passive clock repeater circuit 203, 205, 207, 209 may be implemented as a resonant clock repeater circuit having a narrow band characteristic where a substantial voltage-gain is only available in the desired frequency range (e.g., around target frequency fc) but is very small outside that range. As shown in FIG. 2B with the illustrated example AC gain versus frequency plot 220, the passive resonant clock repeater circuits 203, 205, 207, 209 shown in FIG. 2A will suppress the noise (or undesired coupled signals) if the noise is running at frequencies outside the narrow frequency range (e.g., gain <<1). On the other hand, the passive resonant clock repeater circuits 203, 205, 207, 209 will generate considerable linear voltage-gain (e.g., gain=Av) for the desired clock signals running a frequency inside the frequency band. Therefore, when the clock signal is output from the clock buffer 201 having a first amplitude (e.g., Va), this clock signal is driven by the first clock repeater circuit 203, the resulting clock amplitude (e.g., Va*Av at $VO_1$) will be enhanced by the associated gain factor (e.g., Av), and this amplification result is repeated at each of the other clock repeater circuits 205, 207, 209 in the clock path, resulting in a clock amplitude (e.g., $Va*(Av)^N$ at $VO_N$) at the clock path output.

Figure 3:
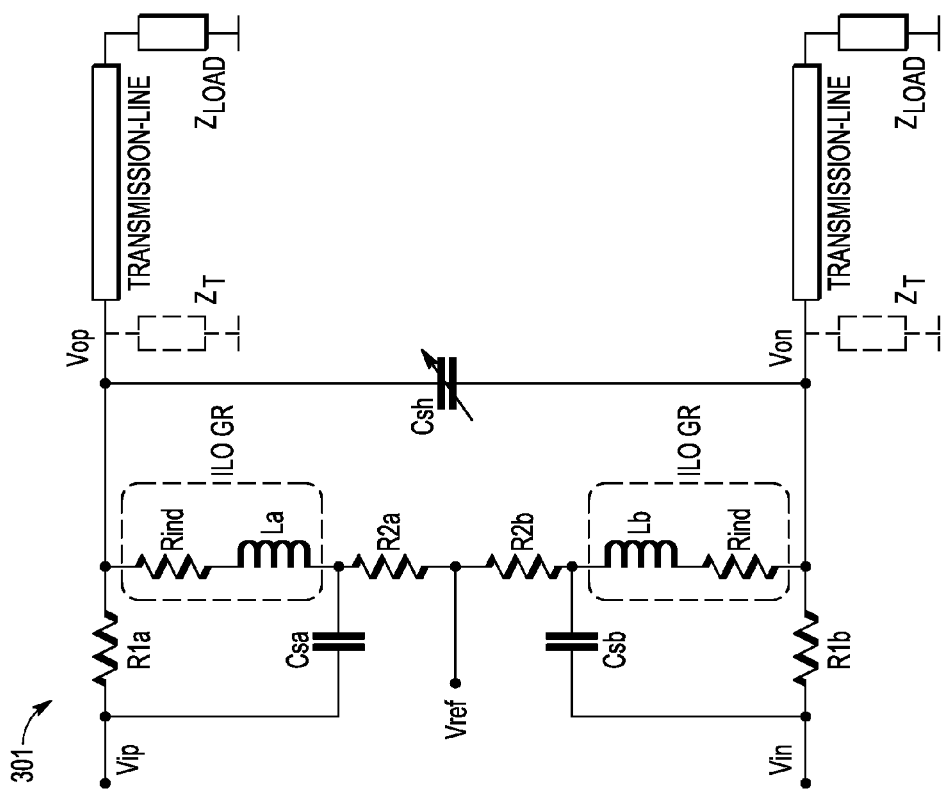
FIG. 3 illustrates a schematic diagram of a first passive clock repeater circuit in accordance selected embodiments of the present disclosure.

FIG. 3 illustrates an example schematic circuit diagram of a first passive clock repeater circuit 301 which uses a differential-mode RLC network to selectively provide gain-boosting at the desired frequency range. The depicted differential-mode RLC network includes half circuits connected, respectively, to the positive and negative clock signal lines Vop, Von running in a differential mode. Each half circuit includes a series capacitor (e.g., Csa or Csb) and series inductor (e.g., La or Lb) (with associated inductor series resistance Rind) that are connected with a resistive voltage divider (R1*a*/R2*a* or R1*b*/R2*b*) as shown between the clock signal lines and a shared reference voltage Vref to form an LC tank in which the resistive voltage divider provides biasing control. In addition, the first passive clock repeater circuit 301 may include a tunable shunt capacitor Csh that is coupled between the differential clock signal lines that may be tuned for the desired operation frequency of the circuit. As will be appreciated, the tunable shunt capacitor Csh may be implemented with a switched capacitor circuit in which a plurality of capacitors are coupled in parallel between the differential clock signal lines under control of switching transistors. The depicted first passive clock repeater circuit 301 may be used in cases where there are no duty-cycle distortions, in which case the reference voltage Vref provides gain-boosting with biasing control at the desired frequency range with attenuated signal gain out of the operating frequency range which is controlled by the tunable shunt capacitor Csh.

Figure 4:
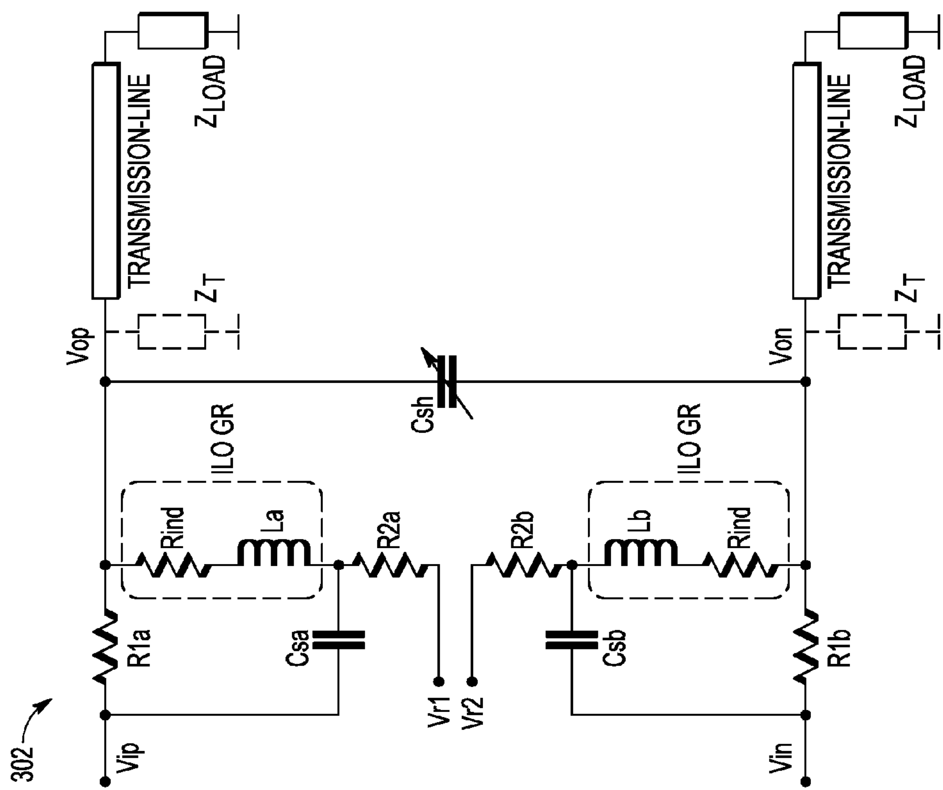
FIG. 4 illustrates a schematic diagram of a second passive clock repeater circuit in accordance selected embodiments of the present disclosure.

In cases where there is mismatch along the differential clock signal paths Vop, Von, the shared reference voltage Vref may be replaced with differential bias voltages, Vr1 and Vr2 in order to adjust the DC levels of the differential clock signal paths and thereby correct the duty-cycle distortions. This is shown in FIG. 4 which illustrates an example schematic circuit diagram of a second passive clock repeater circuit 302 which uses a differential-mode RLC network of half circuits to selectively provide gain-boosting at the desired frequency range which is controlled by a tunable shunt capacitor Csh that is coupled between the differential clock signal lines. As depicted, each half circuit is connected, respectively, to the differential clock signal lines (e.g., positive clock signal line Vop and negative clock signal line Von), and includes a series capacitor (e.g., Csa or Csb) and series inductor (e.g., La or Lb) (with associated inductor series resistance Rind) that are connected with a resistive voltage divider (R1*a*/R2*a* or R1*b*/R2*b*) as shown.

However, instead of being connected to a shared reference voltage Vref, the resistors R2*a*, R2*b* in the resistive voltage divider are connected, respectively, to receive differential bias voltages, Vr1 and Vr2. In this way, the differential clock signals may be applied to provide duty-cycle correction for mismatch along the differential clock signal lines in the depicted second passive clock repeater circuit 302.

Figure 5:
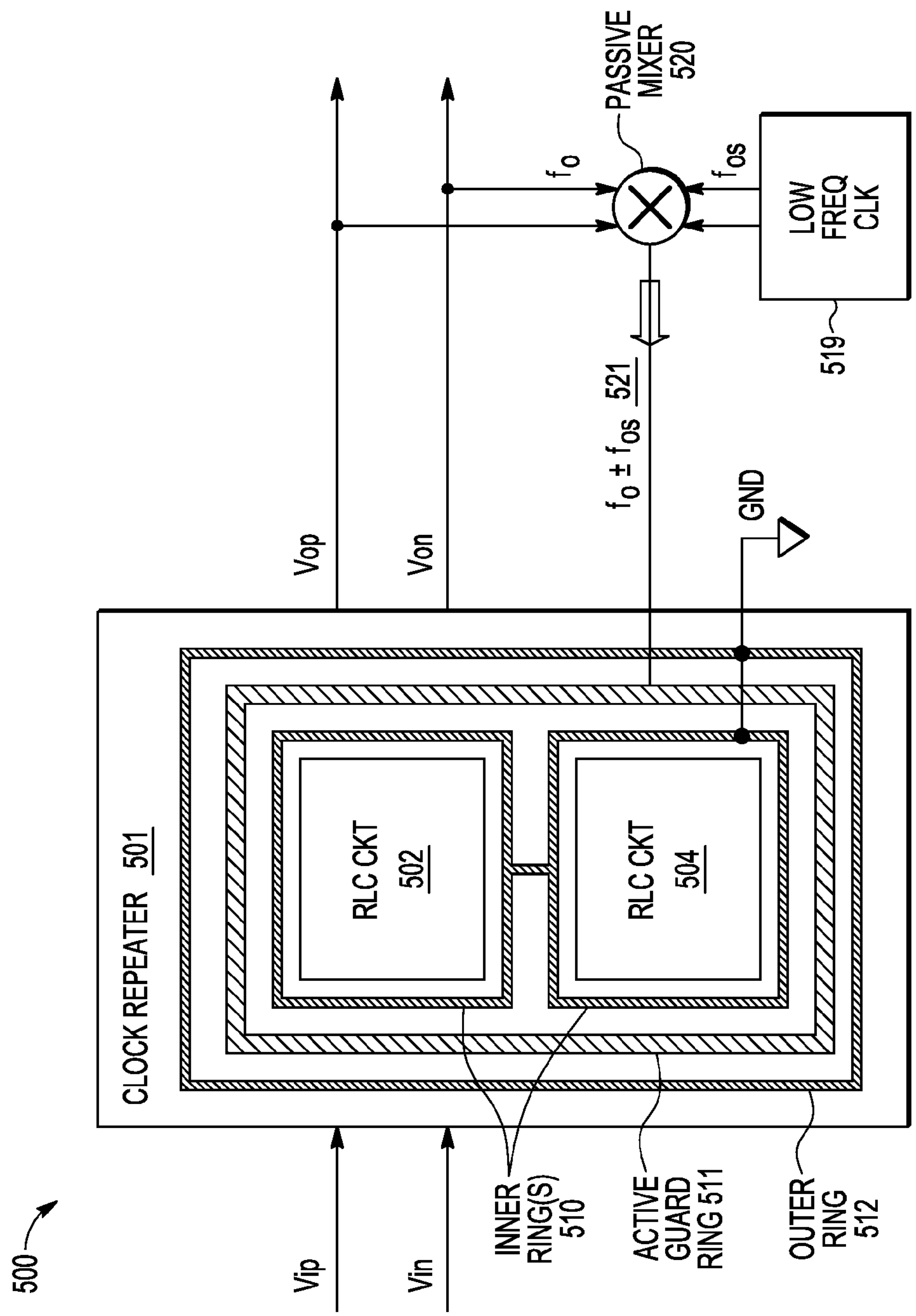
FIG. 5 illustrates a simplified block diagram plan layout view of a passive clock repeater circuit employing an active guard ring to avoid injection-locking effects in accordance selected embodiments of the present disclosure.

While the use of multiple clock repeater circuits provides improved performance and protection against injection locking by virtue of reducing the power requirements for the clock driver circuitry, selected embodiments of the present disclosure provide improved protection against injection locking by incorporating an active guard-ring around the clock repeater circuitry to avoid the injection-locking oscillation (ILO) effects that can cause interference between different clock nets. To illustrate selected example embodiments of such an active guard-ring structure, reference is now made to FIG. 5 which illustrates a simplified block diagram plan view 500 of a passive clock repeater circuit 501 employing an active guard ring 511 to avoid injection-locking effects. The depicted clock repeater circuit 501 is connected to receive the positive and negative clock signal input lines Vip, Vin, and to generate therefrom the positive and negative clock signal output lines Vop, Von using the differential-mode RLC network half circuits 502, 504 which are shown in simplified block diagram form as being laid out in two circuit areas of the clock repeater 501. As formed, the RLC network half circuit areas 502, 504 are surrounded and shielded by an active guard ring 511 which is formed in the substrate and/or metal interconnect layers using conductive dummy tiles and/or layers with connecting conductive via structures which are positioned to form a shielding structure around the RLC network half circuits 502, 504. To generate an active forcing signal 521 at the active guard ring 511, a passive mixer circuit 520 is connected to combine a programmable offset frequency $f_{OS}$ from a low frequency clock source 519 (e.g., a divided PLL reference frequency source) with a clock repeater output signal $f_O$, thereby generating the active forcing signal 521 having a mixer output frequency $f_O \pm f_{OS}$. In this way, the frequency of the active forcing signal 521, $f_O \pm f_{OS}$, is used to deviate the undesired injecting source frequency $f_X$ from the clock repeater outside of the injection locking range for the clock repeater circuit 501 by adding and subtracting an offset frequency $f_{OS}$ indicating a safety margin for the injection locking range $$f_L = 2\left|\frac{\Delta f_o}{f_o}\right|_{Max} = \frac{1}{Q}\frac{I_i}{I_R}.$$

As a result, when a coupled injecting-source $f_X$ presents within the injection locking range of the clock repeater circuit 501, this injecting signal will be locked by the active forcing signal 521 and the resultant new signal will present at a frequency beyond the locking range.

Figure 6:
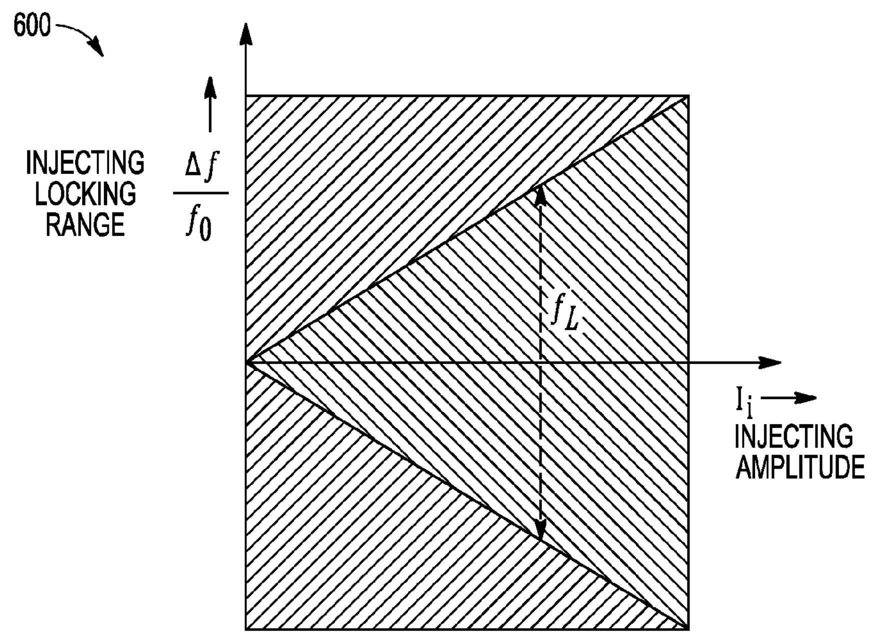
FIG. 6 diagrammatically illustrates the injection locking dynamics between the injection source amplitude and frequency.

To illustrate how the active guard ring 511 protects against injection locking, reference is now made to FIG. 6 which diagrammatically illustrates the injection locking dynamics between the injection source amplitude and frequency. In the depicted diagram 600, the injection locking range $$\Delta f / f_O = \frac{I_i}{I_R}\frac{f_o}{2Q}\sin(\Delta\phi(t))$$

is plotted against the injecting source amplitude $I_i$, where $\Delta f = f_{inj} - f_O$, with $f_{inj}$ representing the injecting source frequency, $f_O$ representing the frequency of the object under attack, with $I_i$ representing the injecting source amplitude, with $I_R$ representing the signal amplitude of the attacked object, and with Q representing the quality factor of the LC tank, and with $\phi(t)$ representing the phase of the signal at the LC resonant circuit output. As a result, the injection locking range $$f_L = 2\left|\frac{\Delta f_o}{f_o}\right|_{Max} = \frac{1}{Q}\frac{I_i}{I_R}$$

is represented as a function of the injecting amplitude $I_i$, indicating that, if the $\Delta f$ is large, the injecting source amplitude, $I_i$, must also be large to get the injection locking condition. However, if the $\Delta f$ is small, even a weak injecting source $I_i$ can create injection locking effects.

Figure 7:
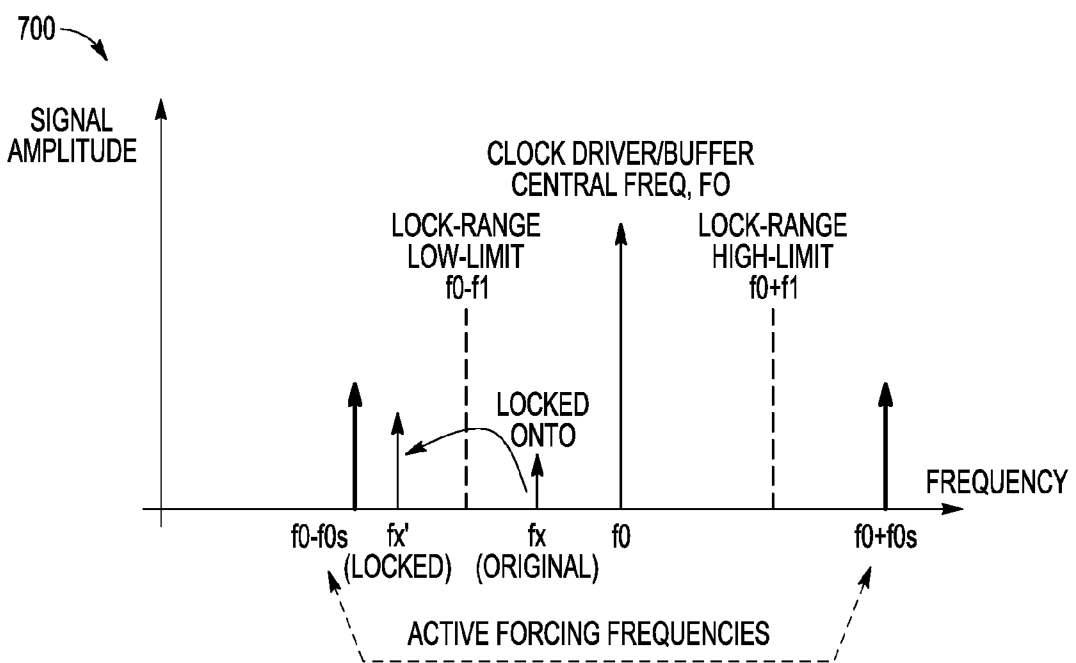
FIG. 7 diagrammatically shows how two frequencies fo±fl are set for protection limits to protect against injection locking with the active guard ring.

As seen from the foregoing, injection locking protection can be achieved by providing a forcing signal 521 so that the active guarding ring 511 has a specified signal amplitude, thereby determining the possible locked (or protection) frequency range $f_L$ against the undesired coupled-source. The relationship of the injection source amplitude on the active guard ring 511 versus the specified frequency protection range can be seen in FIG. 7 which diagrammatically shows how two frequencies $f_0 \pm f_1$ are set for protection limits. By using the frequency offset $f_{OS}$ at the mixer 520, the original undesired coupled source frequency fx at an injecting amplitude is locked onto another frequency fx' outside the harmful frequency range, thereby protecting the inductive components against injection locking effects.

In addition to providing an active guard ring 511 to protect against injection locking, each of differential-mode RLC network half circuits 502, 504 may be also surrounded by a passive inner guard ring 510 which is electrically connected to ground. In addition, an outer or peripheral passive guard ring 512 may also be formed to surround and enclose the differential-mode RLC circuits 502, 504. In this way, the RLC network half circuit areas 502, 504 may be surrounded and shielded by passive guard ring(s) 510, 512 which are formed in the substrate and/or metal interconnect layers using conductive dummy tiles and/or layers with connecting conductive via structures to form a passive shielding structure around the RLC network half circuits 502, 504.

By now it should be appreciated that there is provided herein a clock distribution circuit and method of operation in which a clock generator generates a clock signal that is provided to a clock interconnect which runs to multiple lanes of an integrated circuit chip to provide a high-frequency, low-power clock distribution. In various embodiments, the clock generator may include a phase-locked loop (PLL) circuit and a current-mode logic (CML) buffer. In addition, each lane in the clock interconnect may include a positive clock input line and a negative clock input line for receiving first and second input clock signals, and may also include a positive clock output line and a negative clock output line for providing first and second output clock signals. In addition, each lane in the clock interconnect may include a passive clock repeater circuit which includes a differential-mode RLC network coupled to receive the first and second input clock signals to provide clock signal gain boosting at a predetermined operating frequency range and clock signal attenuation out of the predetermined operating frequency range, thereby generating the first and second output clock signals. In selected embodiments, each differential-mode RLC network may include a programmable shunt capacitor coupled between the positive clock output line and the negative clock output line; a first resonant gain boost circuit connected between the positive clock input line and a first control voltage, the first resonant gain boost circuit comprising a first inductor-capacitor tank and first resistive voltage divider circuit for providing bias control and clock signal gain boosting to the first output clock signal at the predetermined frequency range; and a second resonant gain boost circuit connected between the negative clock input line and a second control voltage, the second resonant gain boost circuit comprising a second inductor-capacitor tank and second resistive voltage divider circuit for providing bias control and clock signal gain boosting to the second output clock signal at the predetermined frequency range. In selected embodiments, the first and second control voltages may be a shared reference voltage. In other embodiments, the first and second control voltages may be separate control voltages which are applied to correct duty cycle distortions on the first and second input clock signals. Each lane in the clock interconnect may also include a clocked circuit coupled to receive the first and second output clock signals from the positive clock output line and negative clock output line. Around each differential-mode RLC network, an active guard ring structure may be formed to surround and shield against injection locking inductive coupling effects. In such embodiments, a passive mixer circuit may be coupled to receive a first signal from the positive clock output line having a first frequency $f_O$ and to receive a second signal from a low frequency clock circuit having a second offset frequency $f_{OS}$, where the passive mixer circuit generates an output signal having a mixed frequency $f_O \pm f_{OS}$ that is connected to drive the active guard ring structure.

In another form, there is provided a method for preventing injection locking in a clock distribution circuit. In various embodiments of the disclosed method, an offset clock signal having a programmable frequency $f_{OS}$ is generated. In selected embodiments, the offset clock signal is generated as low frequency offset clock signal by dividing a phase lock loop (PLL) reference frequency source signal. In addition, the offset clock signal is mixed with an output signal from a clock repeater circuit having a central frequency $f_O$ to generate an active forcing signal having an output frequency $f_O + f_{OS}$. In selected embodiments, a passive mixer circuit is supplied with the output signal and the offset clock signal to generate the active forcing signal. By connecting the active forcing signal to a guard ring disposed around the clock repeater circuit, an injecting signal having an undesired injecting source frequency $f_X$ from the clock repeater is deviated outside of an injection locking range for the clock repeater circuit. In selected embodiments, the guard ring is formed to surround and shield a differential-mode RLC network circuit in the clock repeater circuit from injection locking inductive coupling effects. For example, the clock repeater circuit may be shielded as a passive differential-mode RLC network coupled to receive first and second input clock signals to provide clock signal gain boosting at a predetermined operating frequency range and clock signal attenuation out of the predetermined operating frequency range, thereby generating first and second output clock signals. As a result of connecting the active forcing signal to the guard ring, the injecting signal is locked into a new signal having a frequency beyond the injection locking range.

In yet another form, there is provided integrated circuit device and method of operation to protect against injection locking. As disclosed, the integrated circuit device includes a differential-mode RLC network circuit coupled to receive a first and second input clock signals for generating first and second output clock signals. In selected embodiments, the differential-mode RLC network circuit may include a programmable shunt capacitor coupled between a positive clock output line and a negative clock output line; a first resonant gain boost circuit connected between a positive clock input line and a first control voltage, the first resonant gain boost circuit comprising a first inductor-capacitor tank and first resistive voltage divider circuit for providing bias control and clock signal gain boosting to a first output clock signal at the positive clock output line at a predetermined operating frequency range; and a second resonant gain boost circuit connected between a negative clock input line and a second control voltage, the second resonant gain boost circuit comprising a second inductor-capacitor tank and second resistive voltage divider circuit for providing bias control and clock signal gain boosting to a second output clock signal at the negative clock output line at the predetermined operating frequency range. In selected embodiments, the first and second control voltages may be a shared reference voltage. In other embodiments, the first and second control voltages may be separate control voltages which are applied to correct duty cycle distortions on the first and second input clock signals. The integrated circuit device also includes a low frequency clock for generating an offset clock signal. In addition, the integrated circuit device includes a passive mixer circuit coupled to mix the offset clock signal with the first and second output clock signals from the differential-mode RLC network circuit to generate an active forcing signal. In selected embodiments, the passive mixer circuit is coupled to receive the first output clock signal as a positive clock signal having a first frequency $f_O$ from a positive clock output line of the differential-mode RLC network circuit and to receive the offset clock signal having an offset frequency $f_{OS}$ from the low frequency clock. In selected embodiments, the passive mixer circuit is coupled to receive the second output clock signal as a negative clock signal having a first frequency $f_O$ from a negative clock output line of the differential-mode RLC network circuit and to receive the offset clock signal having an offset frequency $f_{os}$ from the low frequency clock. Finally, the integrated circuit device includes an active guard ring structure formed to surround and shield the differential-mode RLC network circuit from injection locking inductive coupling effects, where the active guard ring structure driven by the active forcing signal to deviate an injecting signal having an undesired injecting source frequency from the differential-mode RLC network circuit outside of an injection locking range for the differential-mode RLC network circuit. The integrated circuit device may also include a passive guard ring structure formed to surround and shield the differential-mode RLC network circuit, where the passive guard ring structure is connected to a ground reference voltage supply.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified block diagrams, schematic diagrams, and charts illustrating design and operational details of a clock path in a data processing system without including every device feature or aspect in order to avoid limiting or obscuring the present invention. Such descriptions and representations are used by those skilled in the art to describe and convey the substance of their work to others skilled in the art, and the omitted details which are well known are not considered necessary to teach one skilled in the art of how to make or use the present invention. Thus, it is to be understood that the circuits depicted herein are merely exemplary. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for preventing injection locking, comprising:

generating an offset clock signal having a programmable frequency $f_{OS}$;

mixing the offset clock signal with an output signal from a clock repeater circuit having a central frequency $f_O$ to generate an active forcing signal having an output frequency $f_O \pm f_{OS}$; and connecting the active forcing signal to a guard ring disposed around the clock repeater circuit to deviate an injecting signal having an undesired injecting source frequency $f_x$ from the clock repeater outside of an injection locking range for the clock repeater circuit.

2. The method of claim 1, where generating the offset clock signal comprises generating a low frequency offset clock signal by dividing a phase lock loop (PLL) reference frequency source signal.

3. The method of claim 1, where mixing the offset clock signal comprises supplying a passive mixer circuit with the output signal and the offset clock signal to generate the active forcing signal.

4. The method of claim 1, where connecting the active forcing signal to the guard ring locks the injecting signal into a new signal having a frequency beyond the injection locking range.

5. The method of claim 1, where the guard ring is formed to surround and shield a differential-mode RLC network circuit in the clock repeater circuit from injection locking inductive coupling effects.

6. The method of claim 1, where the clock repeater circuit comprises a passive differential-mode RLC network coupled to receive first and second input clock signals to provide clock signal gain boosting at a predetermined operating frequency range and clock signal attenuation out of the predetermined operating frequency range, thereby generating first and second output clock signals.

7. An integrated circuit device, comprising:

a differential-mode RLC network circuit coupled to receive a first and second input clock signals for generating first and second output clock signals;

a low frequency clock for generating an offset clock signal;

a passive mixer circuit coupled to mix the offset clock signal with the first and second output clock signals from the differential-mode RLC network circuit to generate an active forcing signal; and an active guard ring structure formed to surround and shield the differential-mode RLC network circuit from injection locking inductive coupling effects, where the active guard ring structure driven by the active forcing signal to deviate an injecting signal having an undesired injecting source frequency from the differential-mode RLC network circuit outside of an injection locking range for the differential-mode RLC network circuit.

8. The integrated circuit device of claim 7, further comprising a passive guard ring structure formed to surround and shield the differential-mode RLC network circuit, where the passive guard ring structure is connected to a ground reference voltage supply.

9. The integrated circuit device of claim 7, where the differential-mode RLC network circuit comprises:

a programmable shunt capacitor coupled between a positive clock output line and a negative clock output line;

a first resonant gain boost circuit connected between a positive clock input line and a first control voltage, the first resonant gain boost circuit comprising a first inductor-capacitor tank and first resistive voltage divider circuit for providing bias control and clock signal gain boosting to a first output clock signal at the positive clock output line at a predetermined operating frequency range; and a second resonant gain boost circuit connected between a negative clock input line and a second control voltage, the second resonant gain boost circuit comprising a second inductor-capacitor tank and second resistive voltage divider circuit for providing bias control and clock signal gain boosting to a second output clock signal at the negative clock output line at the predetermined operating frequency range.

10. The integrated circuit device of claim 9, where the first control voltage and second control voltage comprise a shared reference voltage.

11. The integrated circuit device of claim 9, where the first control voltage and second control voltage comprise separate control voltages which are applied to correct duty cycle distortions on the first and second input clock signals.

12. The integrated circuit device of claim 7, where the passive mixer circuit is coupled to receive the first output clock signal as a positive clock signal having a first frequency $f_O$ from a positive clock output line of the differential-mode RLC network circuit and to receive the offset clock signal having an offset frequency $f_{OS}$ from the low frequency clock.

13. The integrated circuit device of claim 7, where the passive mixer circuit is coupled to receive the second output clock signal as a negative clock signal having a first frequency $f_O$ from a negative clock output line of the differential-mode RLC network circuit and to receive the offset clock signal having an offset frequency $f_{OS}$ from the low frequency clock.

* * * * *